United States Patent [19]
Shinjo et al.

[11] Patent Number: 5,783,284
[45] Date of Patent: Jul. 21, 1998

[54] MAGNETIC MULTILAYER FILM, MAGNETORESISTANCE ELEMENT, AND METHOD FOR PREPARING MAGNETORESISTANCE ELEMENT

[75] Inventors: Teruya Shinjo, 39-1055, Kohata-ogurayama, Uji-shi, Kyoto; Satoru Araki, Chiba, both of Japan

[73] Assignees: TDK Corporation, Tokyo; Teruya Shinjo, Uji, both of Japan

[21] Appl. No.: 594,486

[22] Filed: Jan. 31, 1996

[30] Foreign Application Priority Data

Feb. 1, 1995 [JP] Japan .................. 7-036311

[51] Int. Cl.⁶ .................. G11B 5/127; B32B 3/00
[52] U.S. Cl. .................. 428/161; 428/163; 428/164; 428/167; 428/692; 428/693; 428/900; 428/141; 428/147; 428/148; 428/611; 360/113; 324/252; 338/32 R
[58] Field of Search .................. 428/611, 141, 428/147, 148, 161, 162, 163, 164, 167, 692, 693, 900, 688; 360/113, 120; 324/252; 338/32 R

[56] References Cited

U.S. PATENT DOCUMENTS

| | | | |
|---|---|---|---|
| 4,613,918 | 9/1986 | Kanai et al. | 360/113 |
| 5,366,815 | 11/1994 | Araki et al. | 428/611 |
| 5,510,172 | 4/1996 | Araki et al. | 428/213 |
| 5,514,452 | 5/1996 | Araki et al. | 428/213 |
| 5,530,608 | 6/1996 | Aboaf et al. | 360/113 |
| 5,585,198 | 12/1996 | Maeda et al. | 428/611 |
| 5,589,278 | 12/1996 | Kamijo | 428/611 |
| 5,605,733 | 2/1997 | Ishikawa et al. | 428/65.3 |

OTHER PUBLICATIONS

Teruya Shinjo et al. "Large Magnetoresistance of Field-Induced Giant Ferrimagnetic Multilayers". *Journal of the Physical Society of Japan*, vol. 59, No. 9, pp. 3061–3064, 1990.

H. Yamamoto et al. "Magnetoresistance of Multilayer with Two Magnetic Components". *Journal of Magnetism and Magnetic Materials*, pp. 243–252, 1991.

J. Appl. Phys., vol. 75, No. 10, pp. 6709–6713, May 15, 1994, M. A. M. GIJS, et al., "Perpendicular Giant Magnetoresistance of Microstructures IN Fe/Cr and Co/Cu Multilayers (Invited)".

*Primary Examiner*—Marie Yamnitzky
*Attorney, Agent, or Firm*—Oblon, Spivak, McClelland, Maier & Neustadt, P.C.

[57] ABSTRACT

In a magnetoresistance multilayer film comprising at least two magnetic layers on a substrate, with a nonmagnetic layer intervening between the magnetic layers, each interface between the magnetic layer and the nonmagnetic layer is corrugated in both X and Y directions of a substrate major surface. The corrugations of the interface are formed by providing the substrate surface with a multiplicity of asperities distributed in both X and Y directions and depositing magnetic layers and nonmagnetic layers thereon. The film shows a linear rise of MR change in an applied magnetic field within a very low range of 0 to about 40 Oe.

11 Claims, 7 Drawing Sheets

MAGNETIC MULTILAYER FILM, MAGNETORESISTANCE ELEMENT, AND METHOD FOR PREPARING MAGNETORESISTANCE ELEMENT

BACKGROUND OF THE INVENTION

1. Field of the Invention

This invention relates to a magnetoresistance element for reading a magnetic field strength associated with magnetic recording media and the like as a signal, especially a magnetoresistance element capable of reading a small magnetic field change as a significant electric resistance change signal, a magnetoresistance multilayer film suitable therefor, and a method for preparing the magnetoresistance element.

2. Prior Art

Recently there are growing demands for increased sensitivity of magnetic sensors and increased density of magnetic recording. Researchers strive for the development of magnetoresistance effect type magnetic sensors (simply referred to as MR sensors, hereinafter) and magnetoresistance effect type magnetic heads (simply referred to as MR heads, hereinafter) utilizing magnetoresistance changes. Both MR sensors and MR heads are designed to detect a resistance change of a reading sensor section using a magnetic material for reading an external magnetic field signal. Since the MR sensors and MR heads produce outputs which do not depend on their speed relative to magnetic recording media, the MR sensors have the advantage of high sensitivity and the MR heads have the advantage of high outputs even in high density magnetic recording.

Conventional MR sensors based on anisotropic magnetoresistance effect using magnetic materials such as $Ni_{0.8}Fe_{0.2}$ (Permalloy) and NiCo, however, are short of sensitivity as MR head material for reading ultrahigh density record of the order of several GBPI since their resistance change ratio $\Delta R/R$ is as low as 2 to 5% at most.

Attention is now paid to artificial superlattices having the structure in which thin films of metal having a thickness of an atomic diameter order are periodically stacked since their behavior is different from bulk metal. One of such artificial superlattices is a magnetic multilayer film having ferromagnetic metal thin films and antiferromagnetic metal thin films alternately deposited on a substrate. Heretofore known are magnetic multilayer films of iron-chromium, nickel-chromium, and iron-manganese types (see Japanese Patent Application Kokai (JP-A) No. 189906/1985). Among these, the iron-chromium (Fe/Cr) type was reported to exhibit a magnetoresistance change in excess of 40% at cryogenic temperature (4.2K) (see Phys. Rev. Lett., Vol. 61, page 2472, 1988). This artificial superlattice magnetic multilayer film, however, is not commercially applicable as such because the external magnetic field at which a maximum resistance change occurs (that is, operating magnetic field strength) is as high as ten to several tens of kilooersted (kOe). Additionally, there have been proposed artificial superlattice magnetic multilayer films of Co/Cu and Co/Ag, which require too high operating magnetic field strength.

Under these circumstances, there was proposed a ternary artificial superlattice magnetic multilayer film having two types of magnetic layers having different coercive forces deposited with a non-magnetic layer interposed therebetween and exhibiting a giant MR change due to induced ferrimagnetism. For example, Japanese Patent Application No. 78824/1991 we filed prior to the present application proposes a structure wherein a nonmagnetic layer intervenes between two adjacent magnetic thin films having different values of Hc, the respective layers having a thickness of up to 200 Å. Also the following articles are known.

(a) T. Shinjo and H. Yamamoto, Journal of the Physical Society of Japan, Vol. 59 (1990), page 3061

A structure of $[Co(30)/Cu(50)/NiFe(30)/Cu(50)] \times 15$ herein numerals in parentheses represent the thickness in angstrom of the associated layers and the numeral after x is the number of recurring units (the same applies hereinafter) produced an MR ratio of 9.9% at an applied magnetic field of 3 kOe and about 8.5% at 500 Oe.

(b) H. Yamamoto, Y. Okuyama, H. Dohnomae and T. Shinjo, Journal of Magnetism and Magnetic Materials, Vol. 99 (1991), page 243

In addition to (a), this article discusses the results of structural analysis, changes with temperature of MR ratio and resistivity, changes with the angle of external magnetic field, a minor loop of MR curve, dependency on stacking number, dependency on Cu layer thickness, and changes of magnetization curve.

These ternary artificial superlattice magnetic multilayer films are inferior in the magnitude of MR ratio as compared with Fe/Cr, Co/Cu and Co/Ag, but show a giant MR ratio of about 10% under an applied magnetic field of less than several hundreds of oersted. The disclosure of these articles refers to only MR changes under applied magnetic fields of about several 10 to 100 Oe.

MR change curves under an applied magnetic field of 0 to 40 or 50 Oe are important for MR head materials which are used in practical ultrahigh density magnetic recording. In the above-mentioned conventional ternary artificial superlattices, however, the MR change at an applied magnetic field of 0 is not so increased and it is approximate to 0. A percent increase of MR change reaches maximum at about 60 Oe, marking an MR ratio of about 9%. That is, the MR change curve has a slow rise. Permalloy (NiFe), on the other hand, is not suitable as MR heads for reading ultrahigh density magnetic recording because a slope of MR change at zero magnetic field is approximately 0, the MR ratio remains substantially unchanged, a differential of the MR ratio is approximate to 0, and magnetic field sensitivity is low.

One measure for solving such performance problems is proposed in JP-A 318515/1994 as a "magnetoresistance element comprising a magnetoresistance film having alternately deposited ferromagnetic layers and non-ferromagnetic layers, characterized in that the interface between a ferromagnetic layer and an adjacent non-ferromagnetic layer is inclined relative to the surface of the magnetoresistance film and electric current flows through said magnetoresistance film across said interface."

The magnetoresistance element proposed in the above-cited patent reference, however, is very difficult to manufacture and thus impractical since the magnetoresistance film of multilayer structure must be manufactured in the following manner, for example.

First, using a sputtering method, cobalt (Co) layers of 15 Å thick and copper (Cu) layers of 9 Å thick are alternately deposited 30 cycles on an (upper) surface of a silicon substrate ready for deposition. This results in a magnetoresistance film of multilayer structure on the substrate.

Next, a film of novolak type photoresist is formed on the surface of the magnetoresistance film and the resist film is heat softened to form a tapered mask. This mask gradually decreases its thickness from the right end to the left end of the film (as viewed in the figure attached to the above-cited patent reference, the same applies hereinafter).

Subsequently, the magnetoresistance film is subject to ion milling by irradiating argon ion Ar⁺ from above the tapered mask. As a result, the film is removed more on the left side than on the right side. The residual film is 10 μm as a whole and its thickness, which reflects the shape of the mask, decreases from the right end to the left end.

On the surface of the tapered magnetoresistance film thus obtained, an alumina ($Al_2O_3$) film of 0.1 mm thick serving as a support is deposited by CVD and other techniques. The support is formed on the graded surface of the film (which newly becomes a first film surface) to a substantially uniform thickness.

Next, a film of novolak type photoresist is formed on the back (lower) surface of the silicon substrate, and the resist film is heat softened to form a tapered mask (not shown) as above. This mask has a cross-sectional shape which is tapered such that the thickness decreases from the left end to the right end as opposed to the mask formed on the surface (upper surface) of the silicon substrate. Both the masks have the same degree of taper.

Subsequently, the substrate and the magnetoresistance film are subject to ion milling by irradiating argon ion Ar⁺ from below the mask on the back surface of the substrate. As a result, the substrate is completely removed. The film is removed in a tapered shape reflecting the mask shape. The graded surface of the film thus formed newly becomes a second film surface. In this way, a magnetoresistance film having parallel first and second film surfaces and a uniform thickness is obtained in a state secured to the support.

As mentioned above, the preparation of the magnetoresistance film in the magnetoresistance element proposed in the above-cited patent reference is impractical because many steps are involved, for example, ion milling using a mask must be done two times, and difficult operation is concomitant. The magnetoresistance element proposed in the above-cited patent reference wherein the interface between a ferromagnetic layer and an adjacent non-ferromagnetic layer is inclined relative to the surface of the magnetoresistance film also has the problem that a considerable increase of a vertical component of conduction electrons at the interface is not expectable since the angle of inclination cannot be increased beyond about 30° for manufacturing and other reasons.

DISCLOSURE OF THE INVENTION

Therefore, an object of the present invention is to provide a magnetoresistance film which exhibits a linear rise of MR change under an applied magnetic field in a very low range of 0 to about 40 Oe and is highly sensitive to a magnetic field, a magnetoresistance element using the same, and a method for preparing the magnetoresistance element.

This and other objects are achieved by the invention which is defined below as (1) to (11).

(1) A magnetoresistance multilayer film comprising at least two magnetic layers formed on a substrate having a major surface, with a nonmagnetic layer intervening between the magnetic layers, wherein each interface between the magnetic layer and the nonmagnetic layer has corrugations in both X and Y directions, with the proviso that X direction is a direction parallel to the substrate major surface and Y direction is a direction orthogonal thereto and parallel to the substrate major surface.

(2) The magnetoresistance multilayer film of (1) wherein among the corrugations in X and Y directions, at least those corrugations in one direction satisfy $$2d \leq (D-h) \leq 9D/10$$

wherein the corrugations have an average amplitude h, the magnetoresistance multilayer film has a total thickness D, and one nonmagnetic layer has a thickness d.

(3) The magnetoresistance multilayer film of (1) wherein among the corrugations in X and Y directions, at least those corrugations in one direction satisfy $$0.7 \leq \lambda/h \leq 3.5$$

wherein the corrugations have an average period $\lambda$ and an average amplitude h.

(4) The magnetoresistance multilayer film of (1) wherein the corrugations are formed by providing a multiplicity of fine protrusions on said substrate and depositing magnetic layers and nonmagnetic layers thereon.

(5) The magnetoresistance multilayer film of (4) wherein said protrusions have a semi-spherical, semi-ellipsoidal, hyperboloidal or sinusoidal shape.

(6) The magnetoresistance multilayer film of (1) wherein the corrugations are formed by providing the substrate surface with a multiplicity of first parallel furrows extending in one direction and a multiplicity of second parallel furrows extending in a direction crossing said first parallel furrows and depositing magnetic layers and nonmagnetic layers thereon.

(7) The magnetoresistance multilayer film of (6) wherein said furrows have a semi-circular, semi-elliptic, hyperbolic, sinusoidal, U- or V-shaped cross-sectional shape.

(8) The magnetoresistance multilayer film of (1) wherein the corrugations are periodic corrugations.

(9) The magnetoresistance multilayer film of (2) wherein the direction of those corrugations in one direction is coincident with a direction of current flow.

(10) The magnetoresistance multilayer film of (3) wherein the direction of those corrugations in one direction is coincident with a direction of current flow.

(11) A magnetoresistance element comprising the magnetoresistance multilayer film of (1) as a magnetically sensitive section.

(12) A magnetoresistance element comprising the magnetoresistance multilayer film of (2) as a magnetically sensitive section wherein the direction of those corrugations in one direction is coincident with a direction of measuring current flow.

(13) A magnetoresistance element comprising the magnetoresistance multilayer film of (3) as a magnetically sensitive section wherein the direction of those corrugations in one direction is coincident with a direction of measuring current flow.

(14) A method for preparing the magnetoresistance element of (11), comprising the steps of forming on a surface portion of a substrate corresponding to an underlying portion of the magnetoresistance multilayer film which is a magnetically sensitive section of the element, a multiplicity of fine protrusions or recesses or both distributed in X and Y directions of the surface, and alternately depositing magnetic layers and nonmagnetic layers thereon to form the magnetoresistance multilayer film.

FUNCTION

According to the invention, once a multiplicity of fine asperities such as semi-spherical protrusions are merely formed on the surface of a substrate, a magnetoresistance multilayer film can be formed thereafter by the same process as the prior art film forming process. Then a magnetoresistance multilayer film and hence, a magnetoresistance element can be manufactured in a very simple manner. In the magnetoresistance multilayer film of the invention wherein the interface between magnetic and non-magnetic layers is very finely corrugated because of the manufacturing process as mentioned above, since electric current passes so many interfaces and the angle between the interface and the film surface can be set large, a vertical component of conduction electrons with respect to the interface considerably increases and therefore, a percent magnetoresistance ratio improves.

It can be contemplated to increase the number of interfaces across which electric current passes by forming a multiplicity of parallel furrows on the substrate surface and forming a magnetoresistance multilayer film thereon for waving the interface only in one of X and Y directions. In this case, however, since the direction of the furrows must be set perpendicular to the current flow direction, a limit is imposed on the manufacture and a percent magnetoresistance ratio is not so increased as in the present invention.

ILLUSTRATIVE CONSTRUCTION OF THE INVENTION

The magnetoresistance multilayer film of the invention requires that it have at least two magnetic layers on a substrate having a major surface, with a nonmagnetic layer intervening between the magnetic layers, and that each interface between the magnetic layer and the nonmagnetic layer is corrugated in X and Y directions. It is noted that X direction is a certain direction parallel to the substrate major surface and Y direction is a direction orthogonal (transverse) thereto and parallel to the substrate major surface. The film has an interface which is corrugated in both X and Y directions. Corrugations of the interface thus corrugated consist of line segments which may be either straight or curvilinear or even a mixture thereof. The interface as viewed in a vertical cross section of the magnetoresistance multilayer film may have corrugations of any desired shape, for example, corrugations consisting of straight lines such as triangular and rectangular wave shapes, corrugations consisting of curved lines such as corrugations of continuously arranged semi-circular shapes, corrugations of continuously arranged semi-ellipsoidal shapes, corrugations of continuously arranged hyperbolic shapes, and sinusoidal waves, and corrugations in which sides are curved and the top and bottom are linear, and corrugations in which only the top is curvilinear, for example, semi-circular and the remaining segments are linear. In summary, it is only required that a part of each of corrugations (or asperities) of the interface intersect with a straight line extending in an arbitrary direction in a plane (coextensive plane) of the film surface. Therefore, the corrugations may be either regular or irregular. Differently stated, the corrugations may be either periodic or not.

As mentioned above, each of the interfaces between magnetic layers and nonmagnetic layers of the magnetoresistance multilayer film may be corrugated by forming a multiplicity of fine protrusions or recesses or both distributed in X and Y directions on the substrate surface, and alternately depositing magnetic layers and nonmagnetic layers thereon.

Figure 1:
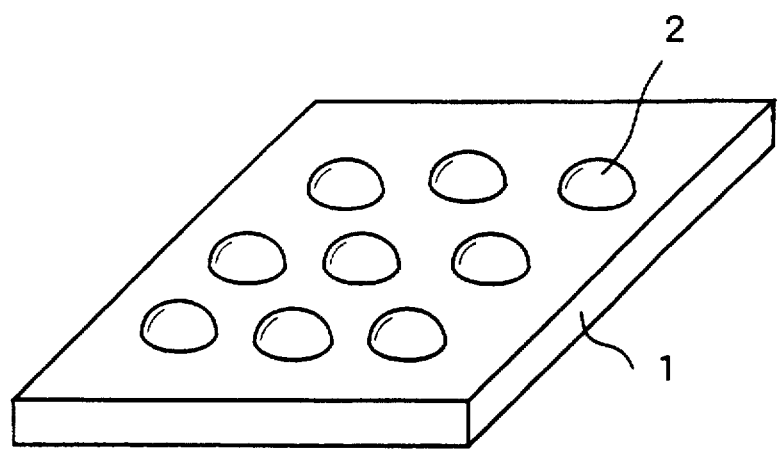
FIG. 1 is a view showing one exemplary substrate used for a magnetoresistance multilayer film according to the invention.
Figure 2:
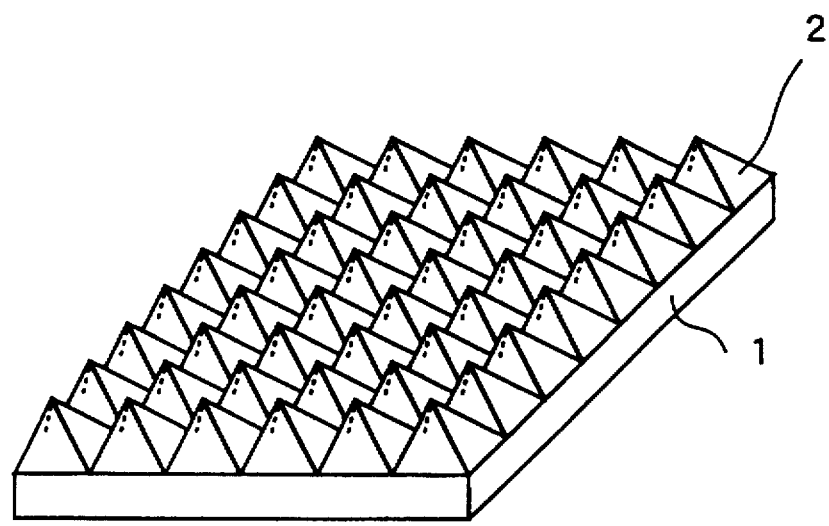
FIG. 2 is a view showing another exemplary substrate used for a magnetoresistance multilayer film according to the invention.

The protrusions may have a semi-spherical shape, conical shape, frusto-conical shape, pyramid shape, frusto-pyramid shape, semi-ellipsoidal shape, hyperboloidal shape, sinusoidal shape or modified shape in which any of these shapes is at least partially deformed. (An example of semi-spherical shape is shown in FIG. 1 wherein numeral 1 is a substrate and numeral 2 designates protrusions. This is sometimes referred to as the first shape substrate, hereinafter. An example of pyramid shape is shown in FIG. 2. This is sometimes referred to as the second shape substrate, hereinafter.) The recesses are preferably provided as a plurality of first parallel furrows extending in one direction and a plurality of second parallel furrows extending in a direction crossing the first parallel furrows wherein the furrows have a cross-sectional shape which is preferably semi-elliptic, hyperbolic, sinusoidal, U or V shaped.

It is preferred that among the corrugations of the interface, at least those corrugations in one of X and Y directions, more preferably the corrugations in both the directions satisfy $2d \leq (D-h) \leq 9D/10$ wherein h is an average amplitude (or height) of the corrugations, D is a total thickness of the magnetoresistance multilayer film, and d is a thickness of one nonmagnetic layer. Each thickness d and D is an average of thicknesses as measured at the crest or bottom of corrugations.

Figure 3:
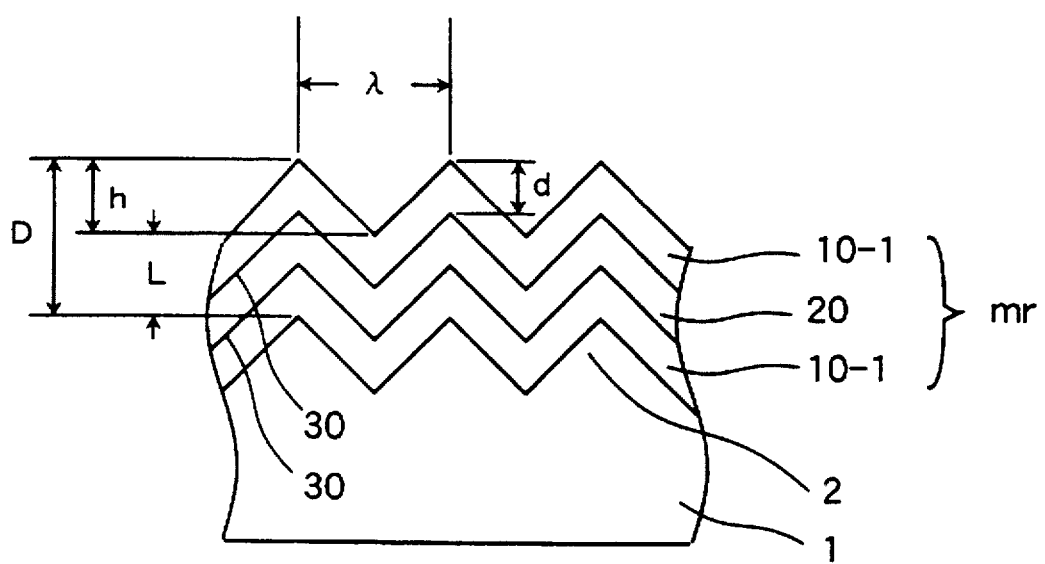
FIG. 3 is a schematic view for explaining the principle of the invention.

The reason is described below. For simplicity's sake, the following description is based on the assumption that as shown in FIG. 3 which is a view in a vertical cross section in one direction of a magnetoresistance multilayer film mr, the interface 30 between a magnetic layer 10 (10-1 and 10-2) and a nonmagnetic layer 20 is corrugated in periodic triangular wave form in the vertical cross section in one direction.

Conditions associated with D and h are considered. The total film thickness D includes at least (as a minimum unit) three layers, that is, a first magnetic layer 10-1, a nonmagnetic layer 20, and a second magnetic layer 10-2. It is noted that L=D-h is the distance in a film thickness direction that electrons can linearly migrate along the potential difference given by an applied voltage. As L decreases, electrons are disturbed by the corrugations h and physically scattered in accordance with the shape of corrugations. This results in a rapid increase of resistivity and a reduced MR ratio. L must be equal to or greater than 2d. Such a great MR change is induced by the mechanism that electrons pass many times across different magnetic layers having a relative angle. Therefore, since the minimum arrangement is that electrons are scattered by the interface between nonmagnetic and magnetic layers, the thickness of the magnetic layer is not relevant. In the minimum case, L is twice the thickness d of the nonmagnetic layer. If L is smaller than 2d, then resistivity increases, failing to achieve a substantial MR change. Preferably L is at least 3d, more preferably at least 4d.

The upper limit of L is 9D/10. With greater values of L, substantial current flowing across L is always subject to similar magnetic scattering to exhibit a substantial MR change as long as the magnetoresistance multilayer film is ideally formed. However, if values of L are excessively high, h is relatively reduced. Thus L is preferably up to 9D/10.

The average period $\lambda$ of the corrugations is also important. The preferred average period of the corrugations is determined by the amplitude (height) thereof. That is, $0.7 \leq \lambda/h \leq 3.5$. Our experiment in which evaluation was done while varying the size of asperities causing corrugations and the average spacing thereof showed that electrons are incident on the interface at an angle of about 30 to 70 degrees when $\lambda/h$ is within the range, and as a result, a greater MR ratio and slope are obtained as compared with a flat interface. Below the range, the structure of multilayer film as deposited contains more defects, resulting in a decrease of MR ratio. Beyond the range, corrugations become moderate so that passage of electrons across multiple interfaces is substantially reduced, failing to achieve a greater MR change. It is preferred that D is about 100 to 20,000 Å, h is about 30 to 10,000 Å, and X is about 20 to 50,000 Å.

Although the type of magnetic material used in the magnetic thin films of the invention is not critical, it is preferably Fe, Ni, Co, Mn, Cr, Dy, Er, Nd, Tb, Tm, Ce, Gd or the like. Preferred alloys and compounds containing these elements include, for example, Fe-Si, Fe-Ni, Fe-Co, Fe-Al, Fe-Al-Si (Sendust, etc.), Fe-Y, Fe-Gd, Fe-Mn, Co-Ni, Cr-Sb, Fe base amorphous alloys, Co base amorphous alloys, Co-Pt, Fe-Al, Fe-C, Mn-Sb, Ni-Mn, Co-O, Ni-O, Fe-O, Fe-Al-Si-N, Ni-F, and ferrite. In the present invention, magnetic thin films are formed by selecting two or more materials having different coercivity from these magnetic materials.

The upper limit of the average thickness of magnetic thin films is 200 Å. On the other hand, the lower limit of the average thickness of magnetic thin films is not critical although films of less than 4 Å thick is impractical because their Curie point is lower than room temperature. A thickness of at least 4 Å makes it easy to form films of uniform thickness and superior quality and avoids excessive lowering of the magnitude of saturation magnetization. A film thickness in excess of 200 Å does not adversely affect the effect, but is uneconomical since the effect is not further increased by an increase of film thickness and the manufacture of films entails more waste.

The nonmagnetic layers used herein are made of a material which plays the role of weakening the magnetic interaction between magnetic layers. The type of nonmagnetic material is not critical and a choice may be made among various metallic or metalloid nonmagnetic materials and non-metallic nonmagnetic materials. The preferred metallic nonmagnetic materials include Au, Ag, Cu, Pt, Al, Mg, Mo, Zn, Nb, Ta, V, Hf, Sb, Zr, Ga, Ti, Sn, Pb, etc. and alloys thereof. The preferred metalloid nonmagnetic materials include Si, Ge, C, B, etc. with optionally another element added. The preferred nonmetallic nonmagnetic materials include $SiO_2$, SiO, SiN, $Al_2O_3$, ZnO, MgO, TiN, etc. with optionally another element added.

Preferably the nonmagnetic layers have an average thickness of up to 200 Å. In general, with a layer thickness in excess of 200 Å, resistance is determined by nonmagnetic layers and the proportion of spin scattering is reduced, resulting in a lower MR ratio. On the other hand, a too thin nonmagnetic layer allows greater magnetic interaction between magnetic layers, reducing the probability of both magnetic layers having different magnetization directions and making it difficult to form continuous layers. For these reasons, a layer thickness of at least 4 Å is preferred. The thickness of magnetic and nonmagnetic layers can be determined by observation under a transmission electron microscope or scanning electron microscope or by Auger electron spectroscopy. The crystal structure of layers can be ascertained by X-ray diffraction, high energy electron diffraction or the like.

In the magnetoresistance multilayer film, the number of magnetic layers is 2 to about 100 and the number of nonmagnetic layers is 1 to about 99 for the following reasons. As the number of layers increases, the MR ratio increases, but at the same time productivity becomes lower and the cost of manufacture increases. From an application aspect, the thinner the layers, a magnetoresistance element can be manufactured to higher recording sensitivity. For this reason, the upper limit is defined as above.

As mentioned above, when each of the interfaces between magnetic layers and nonmagnetic layers is corrugated in X and Y directions, the magnetoresistance multilayer film as deposited has a high MR ratio of about 4 to 20% and an MR change of high linearity and great gradient at zero magnetic field. More particularly, the MR slope (differential value of MR ratio) is about 0.3 to 0.9%, which is satisfactory as a reading MR head for ultrahigh density recording.

Figure 5:
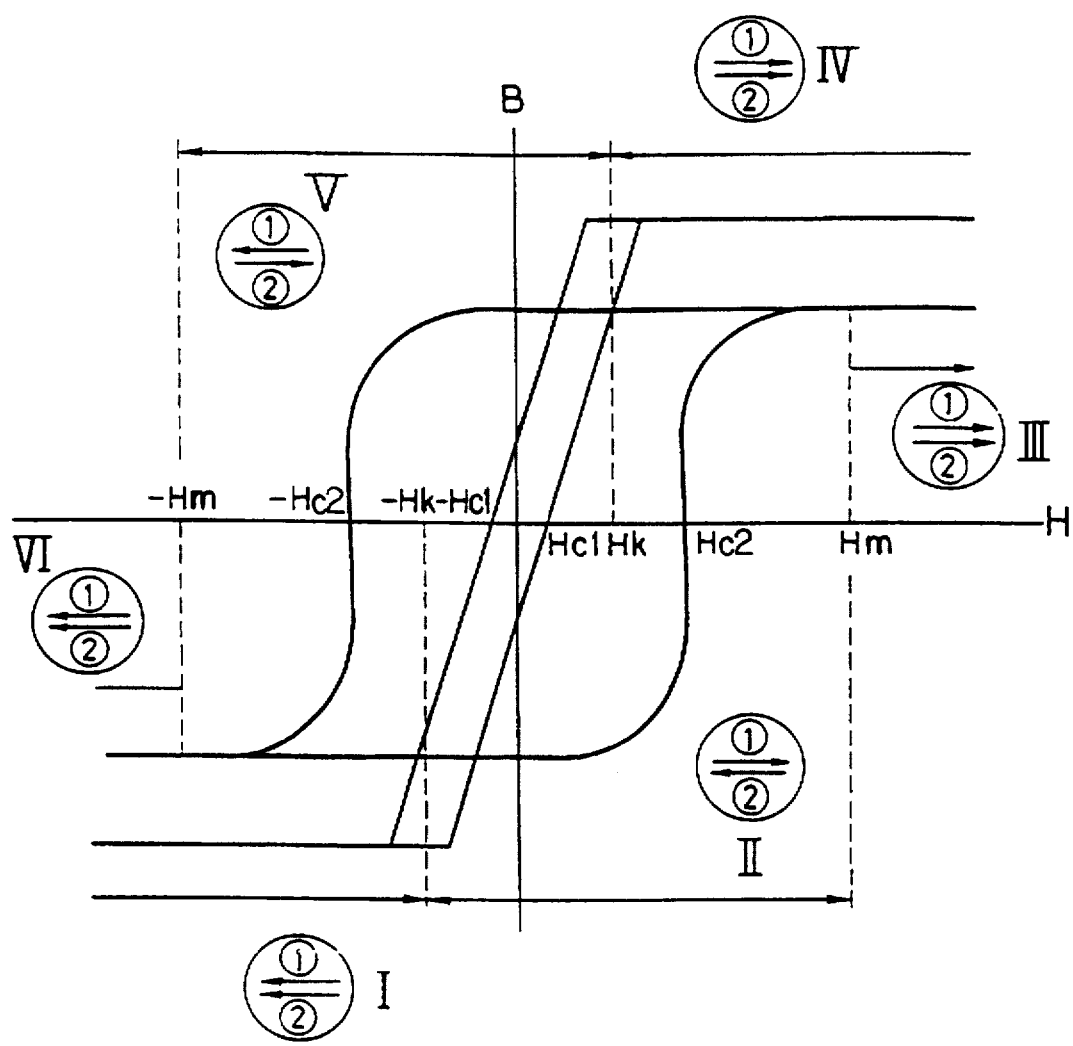
FIG. 5 is a diagrammatic view of a B-H curve for illustrating the operation of the magnetoresistance multilayer film of FIG. 4.

It is preferred in the practice of the invention that adjacent magnetic layers (sometimes referred to as magnetic thin films, hereinafter) sandwiching a nonmagnetic layer (sometimes referred to as a nonmagnetic thin film, hereinafter) have different coercive forces. The reason is that one of the principles of the invention is that conduction electrons are subject to spin-dependent scattering to increase electrical resistance as the adjacent magnetic layers are offset in the direction of magnetization, and the resistance reaches maximum when the adjacent magnetic layers have opposite directions of magnetization. More specifically, as shown in FIG. 5, when an external magnetic field is between the coercive force $Hc_1$ of a first magnetic thin film and the coercive force $Hc_2$ of a second magnetic thin film ($Hc_1 < H < Hc_2$), adjacent magnetic thin films have oppositely directed components of magnetization, resulting in an increase of resistance.

Figure 4:
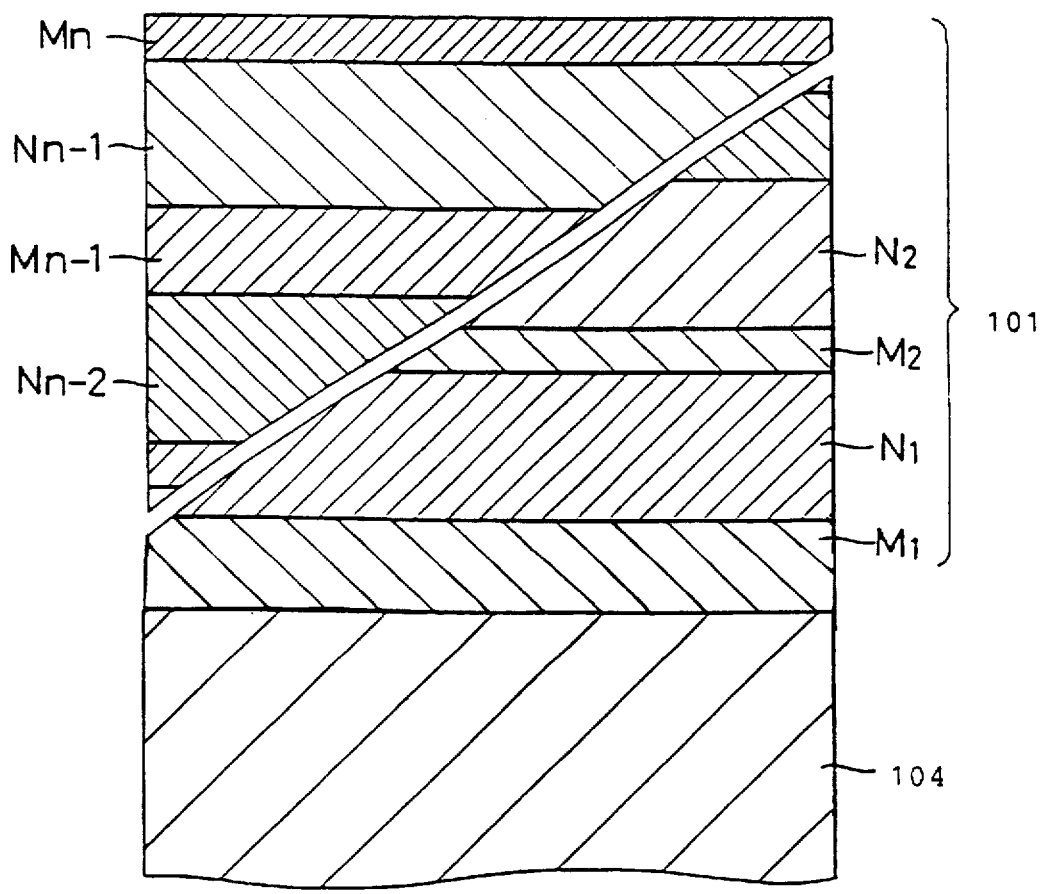
FIG. 4 is a partially cut-away cross-sectional view showing a magnetoresistance multilayer film according to one embodiment of the invention.

Described below is the relationship of the coercivity and magnetization direction of a three dimensional artificial superlattice multilayer magnetic film to an external magnetic field. FIG. 4 is a cross-sectional view of one example of an artificial superlattice multilayer magnetic film 101 according to the invention. In FIG. 4, the artificial superlattice multilayer magnetic film 101 includes magnetic thin films $M_1$, $M_2$, ..., $M_{n-1}$, and $M_n$ on a substrate 104 and nonmagnetic thin films $N_1$, $N_2$, ..., $N_{n-2}$, and $N_{n-1}$ between two adjacent ones of the magnetic thin films.

For the sake of brevity of description, reference is made to a structure having only two types of magnetic thin films having different coercive forces. Assume that two types of magnetic thin films (1) and (2) have different coercive forces $Hc_1$ and $Hc_2$ ($0<Hc_1<Hc_2$), respectively, the first magnetic thin film (1) has an anisotropic magnetic field Hk, and the magnetization of the second magnetic thin film (2) is saturated at an external magnetic field Hm as shown in FIG. 5. At the initial, an external magnetic field H is applied wherein H<−Hcm. The first and second magnetic thin films (1) and (2) have magnetization directions oriented in a negative (−) direction as is H. Then the external magnetic field is increased to region I of H<−Hk where both the magnetic thin films still have magnetization directions oriented in one direction. As the external magnetic field is increased to region II of −Hk<H<$Hc_2$, magnetic thin film (1) partially starts reversing its magnetization direction so that the magnetization directions of magnetic thin films (1) and (2) may include opposite components. The magnetization directions of magnetic thin films (1) and (2) are in substantially complete anti-parallelism in the range of Hk<H<$Hc_2$. When the external magnetic field is further increased to region III of Hcm<H, magnetic thin films (1) and (2) have magnetization directions aligned in a positive (+) direction.

Now, the external magnetic field H is reduced. In region IV of Hk<H, the magnetic thin films (1) and (2) have magnetization directions still aligned in a positive (+) direction. In region V of −Hm<H<Hk, the magnetic thin film (1) starts reversing its magnetization direction in one direction so that the magnetization directions of magnetic thin films (1) and (2) may include opposite components. Subsequently in region VI of H<−Hcm, the magnetic thin films (1) and (2) have magnetization directions aligned in one direction again. In the regions II and V where the magnetic thin films (1) and (2) have opposite magnetization directions, conduction electrons are subject to spin-dependent scattering, resulting in an increased resistance. In the zone of −Hk<H<Hk in region II, since magnetic thin film (2) undergoes little magnetization reversal, but magnetic thin film (1) linearly increases its magnetization, the proportion of conduction electrons subject to spin-dependent scattering is gradually increased in accordance with a magnetization change of magnetic thin film (1). By selecting a low Hc material such as $Ni_{0.8}Fe_{0.2}$ ($Hc_2$=up to several oersteds) as the first magnetic thin film (1), imparting appropriate Hk thereto and selecting a somewhat high Hc, high squareness ratio material such as Co ($Hc_3$=several tens of oersted) as the second magnetic thin film (2), for example, there is obtained an MR element exhibiting a great MR ratio in a low external magnetic field in the range of several oersteds to several tens of oersted near or below Hk.

The respective magnetic layers (thin films) have coercive forces Hc which may be suitably selected in the range of, for example, 0.001 Oe to 10 kOe, especially 0.01 to 1000 Oe, depending on the strength of an applied external magnetic field and the MR ratio required for the element associated therewith. This is true whether or not adjacent magnetic layers (thin films) have different coercive forces. When adjacent magnetic thin films have different coercive forces, the ratio of coercive force $Hc_2/Hc_1$ is preferably from 1.2:1 to 100:1, especially from 1.5:1 to 100:1, more preferably from 2:1 to 80:1, especially from 3:1 to 60:1, most preferably from 5:1 to 50:1, especially from 6:1 to 30:1. Outside the range, a higher ratio would result in a broader MR curve whereas a lower ratio leads to a smaller difference between coercive forces, failing to take advantage of anti-parallelism.

Magnetic properties such as coercive force Hc are measured as follows because it is impossible to directly measure the magnetic properties of magnetic thin films in a magnetoresistance element. For example, magnetic thin films to be measured are deposited by evaporation alternately with nonmagnetic thin films until the total thickness of the magnetic thin films reaches about 200 to 400 Å. The resulting sample is measured for magnetic properties. It is to be noted that the thickness of magnetic thin films and the thickness and composition of nonmagnetic thin films are the same as in a magnetoresistance effect-measuring element.

In order to provide an MR curve having good linearity across zero magnetic field and improved heat resistance, the low-Hc first magnetic thin film and the high-Hc second magnetic thin film should preferably have controlled residual magnetization Mr at zero magnetic field, that is, squareness ratio SQ=Mr/Ms. The first magnetic thin film should preferably have a squareness ratio $SQ_1$ of $0.01 \leq SQ_1 \leq 0.5$, more preferably $0.01 \leq SQ_1 \leq 0.4$, most preferably $0.01 \leq SQ_1 \leq 0.3$. The second magnetic thin film should preferably have a squareness ratio $SQ_2$ of $0.7 \leq SQ_2 \leq 1.0$. Since the first magnetic thin film governs the rise of MR change in the vicinity of zero magnetic field, its squareness ratio $SQ_1$ is preferably as small as possible. More particularly, with smaller $SQ_1$, magnetization will gradually rotate and anti-parallelism will gradually increase in the vicinity of zero magnetic field, resulting in a linear MR curve across zero magnetic field. With $SQ_1$ greater than 0.5, it is difficult to provide a linear MR change. The lower limit of $SQ_1$ from the manufacturing aspect is about 0.01.

The second magnetic thin film to be combined with the first magnetic thin film mentioned above should preferably have a squareness ratio $SQ_2$ close to 1 in the vicinity of zero magnetic field. With a squareness ratio $SQ_2$ of 0.7 or higher, there are achieved a sharp rise of MR change in the vicinity of zero magnetic field and a greater MR ratio. It is noted that the first magnetic thin film preferably has an anisotropic magnetic field Hk of 1 to 20 Oe, more preferably 2 to 12 Oe, especially 3 to 10 Oe. With Hk>20, the range of magnetic field where linearity is exhibited is expanded, but an MR curve will have a reduced slope and resolution declines. With Hk<1 Oe, the range of magnetic field where linearity is exhibited is narrowed so that the function of an MR element is lost.

Preferably $SQ_2/SQ_1$ is between 2 and 100, especially between 2 and 50.

It is further preferred to more positively control the squareness ratio or rise of an MR change curve and the heat resistance by optimizing the thickness of first and second magnetic thin films. When the first and second magnetic thin films have the same thickness as in almost all examples in the above-referred articles (a) and (b), the squareness ratios of both the thin films approach to 1.0 as their thickness increases. Then a magnetization curve does not show a definite bend of magnetization. As a result, an MR change curve is poorly linear at zero magnetic field since it starts rising at several tens of oersted. Therefore, as both the magnetic thin films become thinner, there manifest better linearity and better rise. However, a problem of heat resistance arises when both the thin films are as thin as about 10 Å, for example. More particularly, when heated in vacuum at about 350° C., the second magnetic thin film is not so affected by deterioration of squareness ratio, but the first magnetic thin film undergoes a serious deterioration of squareness ratio. As the first magnetic thin film becomes thicker, its squareness ratio approaches to 1.0. Therefore, when the first magnetic thin film is made relatively thicker independent of the second magnetic thin film, the process will result in better MR characteristics after heat treatment. This suppresses the deterioration of squareness ratio of the first magnetic thin film after heat treatment and improves heat resistance.

That is, in addition to the control of $SQ_1$ and $SQ_2$, it is preferred to further control film thickness so as to fall in the range:

$$4 \text{ Å} \leq d_2 < 30 \text{ Å}, \ 20 \text{ Å} < d_1 \leq 200 \text{ Å}, \text{ and } d_2 < d_1,$$

more preferably $$4 \text{ Å} \leq d_2 \leq 28 \text{ Å}, \ 22 \text{ Å} \leq d_1 \leq 100 \text{ Å}, \text{ and } 1.05 d_2 < d_1$$

wherein the first and second magnetic thin films have an average film thickness $d_1$ and $d_2$, respectively. If $d_2$ is equal to or greater than 30 Å, the entire resistivity increases and eventually, the MR ratio decreases. With $d_2$ less than 4 Å, formation of a continuous film is impossible as previously mentioned. With $d_1$ less than 20 Å, heat resistance lowers.

The upper limit of $d_1$ is desirably 200 Å, especially 100 Å from the standpoint of linearity. If $d_2 \geq d_1$, then heat resistance lowers so that an MR ratio becomes low after a heating step in the manufacturing process.

By controlling the squareness ratio and thickness of the first and second magnetic thin films in this way, a magnetic multilayer film as just deposited exhibits a higher MR ratio, higher linearity at zero magnetic field and an MR change with a greater gradient.

By further controlling $d_2$ and $d_1$ as mentioned above, the invention succeeds in improving heat resistance and minimizing the deterioration of characteristics, especially deterioration of MR ratio by heat treatment. More specifically, after heat treatment in vacuum at 350° C., the MR ratio can be maintained at or above 75% of that prior to the heat treatment, that is, an MR ratio of at least 5%, especially at least 6% is exhibited. This heat treatment is involved in the MR head manufacturing process, for example, as previously mentioned. By properly selecting parameters, the slope at zero magnetic field as represented by the difference in MR ratio in an applied magnetic field between −3 Oe and +3 Oe is rather improved in some cases. The MR ratio will range from a 25% decrease to a 100% increase relative to the value prior to heat treatment. A slope of at least 0.5%, for example, 1 to 2% necessary for a reading MR head for ultrahigh density magnetic recording can still be exhibited even after heat treatment. After heat treatment, $SQ_1$ remains at a value of 0.01 to 0.5 and $SQ_2$ remains at a value of 0.7 to 1.0.

In the present invention, the number (n) of recurring laminate layers of the artificial superlattice magnetic multilayer film is not critical and may be suitably selected in accordance with a desired magnetoresistance ratio. In order to provide a satisfactory magnetoresistance ratio, n is preferably at least 2. As the number of layers increases, the magnetoresistance ratio also increases, but productivity lowers. With too large n, the element as a whole would have a too low resistance and be inconvenient for practical use. Usually, a number (n) of up to 50 is preferred. It is noted that the long periodicity structure can be observed by taking a small angle X-ray diffraction pattern where primary and secondary peaks corresponding to a recurring periodicity appear.

For application to MR heads used in ultrahigh density magnetic recording in excess of 1 Gbit/in², it is preferred that the number (n) is up to 5 and the respective layers of the magnetic multilayer film are thinner because the shield length is reduced to allow for reading-out of higher density signals. However, if the layers are too thin, soft magnetic, ferromagnetic and anti-ferromagnetic characteristics required for the respective layers are lost and heat resistance becomes poor. While the present invention is characterized by a reduced number of magnetic layers stacked, no satisfactory magnetoresistance effect is accomplished unless the respective magnetic layers perform well. Since the magnetostatic bond and direct exchange interaction between respective layers are substantially reduced in a magnetic multilayer film having a small number of magnetic layers, the magnetic layers may be made thick as compared with a magnetic multilayer film having a large number of magnetic layers and an increased total thickness. If the respective magnetic layers are too thick, however, the probability of conduction electrons being scattered becomes low at a certain relative angle between spins of the two types of magnetic layers and the magnetoresistance effect is rather reduced. Increased resistivity is inconvenient for multilayer application. If a nonmagnetic metal layer is too thick, most conduction electrons pass through this nonmagnetic metal layer and a smaller proportion of conduction electrons are scattered in magnetic layers, resulting in a lower percent MR ratio. Conversely, if a nonmagnetic metal layer is too thin, a greater magnetic interaction occurs between magnetic layers, with the likelihood of the two magnetic layers having different magnetization directions being lost. For this and other reasons, the present invention limits the thickness of the respective layers in a magnetic multilayer film having n of up to 5 such that the first magnetic layers have an average thickness $d_1$, the second magnetic layers have an average thickness $d_2$, and the non-magnetic metal layers have an average thickness $d$ wherein $$10 \text{ Å} \leq d_1 \leq 80 \text{ Å},$$

$$20 \text{ Å} \leq d_2 \leq 90 \text{ Å}, \text{ and}$$

$$20 \text{ Å} \leq d \leq 90 \text{ Å},$$

preferably 20 Å $\leq d_1, d_2, d \leq$ 80 Å.
more preferably 20 Å $\leq d_1, d_2, d \leq$ 70 Å. Understandably, the thickness of the respective layers can be measured by means of a transmission electron microscope or scanning electron microscope or by Auger electron spectroscopy. The crystal structure of layers can be observed by X-ray diffraction or high energy electron diffraction.

It is the spins of both the first and second magnetic layers that contributes to scattering of conduction electrons. Most efficient scattering occurs when both the spins are of substantially the same magnitude, that is, when the total quantity of magnetization a number ($N_1$) of first magnetic layers possess is approximately equal to the total quantity of magnetization a number ($N_2$) of second magnetic layers possess. Because of $N_1 > N_2$, more efficient scattering occurs when the quantity of magnetization of a single first magnetic layer is smaller than the quantity of magnetization of a single second magnetic layer. More particularly, more efficient scattering of conduction electrons occurs when the respective magnetic layers are preferably adjusted in thickness so as to meet $$0.3 \leq M_1/M_2 \leq 0.8,$$

more preferably $0.4 \leq M_1/M_2 \leq 0.8$
provided that a single first magnetic layer has a quantity of magnetization $M_1$ and a single second magnetic layer has a quantity of magnetization $M_2$. With this adjustment, the region of the magnetic multilayer film which does not contribute to scattering of conduction electrons can be reduced. Understandably, $M_1/M_2$ is obtained by multiplying the magnetization (magnetic moment per unit volume) of each magnetic layer by its thickness and dividing the product for the first magnetic layer by the product for the second magnetic layer. The magnetization of each magnetic layer is measured using the above-mentioned sample for coercive force measurement. Where all of the first magnetic layers are not equal in thickness, the magnetization per layer is determined using an average thickness of the first magnetic layers. This is also true for the second magnetic layers.

Although only two types of magnetic thin films having different coercive forces are used as magnetic thin films in the illustrated embodiment, use of more than two types of magnetic thin films having different coercive forces permits setting of two or more external magnetic fields where the magnetization direction is reversed so that the range of operating magnetic field strength can be increased.

For the purposes of mitigating the difference in surface energy between the substrate material and the material of the magnetoresistance multilayer film (inclusive of the artificial superlattice) and improving the wetting therebetween for accomplishing a multilayer structure having a flat interface over a wide area, a thin film of Cr, Fe, Co, Ni, W, Ti, V, Mn or an alloy thereof having a thickness of about 10 to 100 Å may be provided as the underlying layer. On the surface of the uppermost magnetic layer (thin film), there may be provided an anti-oxidation film of silicon nitride or silicon oxide or a metal conductive layer for tapping to an electrode.

Next, a process of manufacturing the magnetoresistance multilayer film according to the invention is described.

In the manufacture of a magnetoresistance multilayer film, the substrate is first formed on its surface with asperities as mentioned previously. The substrate may be glass, silicon, $Al_2O_3$—TiC, MgO, GaAs, ferrite, CaTiO, etc. As exemplary asperities, it is described how to form the first and second shape substrates shown in FIGS. 1 and 2.

Figure 6:
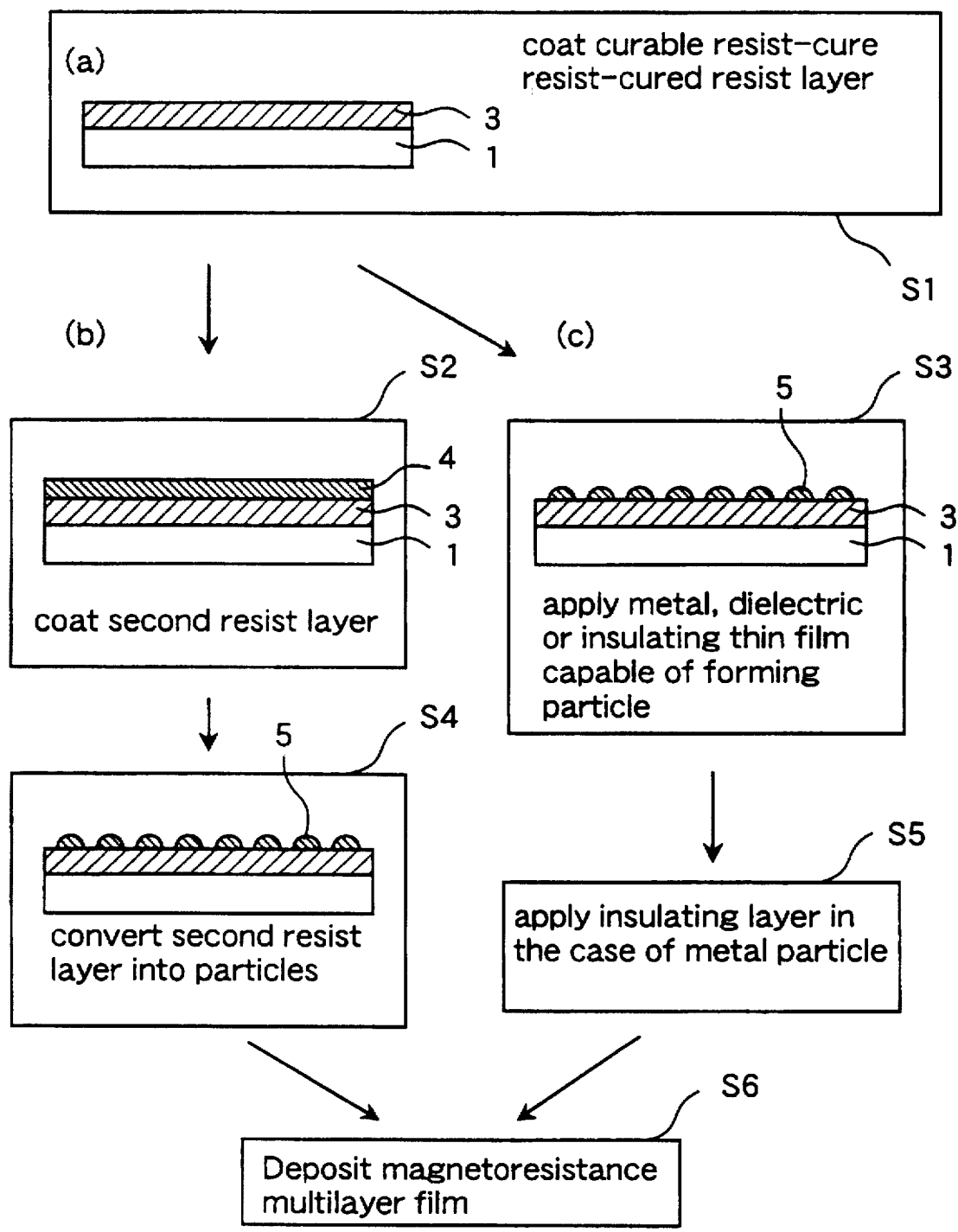
FIG. 6 is a view for illustrating a method for preparing the substrate shown in FIG. 1.

Referring to FIG. 6, formation of the first shape substrate is first described.

In step S1, after a substrate 1 is subject to an arbitrary treatment step such as surface treatment, a curable resist is coated to its surface to form a curable resist layer 3. The treatment step used herein may be cleaning and activation of the surface by plasma exposure, and cleaning of the surface with surfactants or the like for lowering surface energy, for example. The curable resist used herein is preferably a novolak photoresist or polyimide photoresist.

Since the curable resist layer 3 is formed for the purpose of providing an insulating layer in the manufacture of the element, its thickness is desirably as thin as possible, typically 0.005 to 1.0 μm.

The thus formed curable resist is then cured, for example, by heating at a temperature of about 110° to 400° C.

An insulating layer of $Al_2O_3$, $SiO_2$ or the like may be physically deposited instead of the curable resist.

Next, the process proceeds to steps S2 or step S3. Step S2 is first described. A protrusion-forming resist is coated on the surface of the cured resist layer 3 to form a second resist layer 4. The protrusion-forming resist used herein is preferably an insulating thermosetting material which has a lower melting point and poor wettability to the cured resist, for example, polymeric insulating materials and novolak resists. The thickness of the second resist layer 4 is described later.

Next, in step S4, the second resist layer 4 is heated to liquefy the resist material to form a multiplicity of fine semi-spherical particles 5 due to its surface tension, which are dried as such whereby the particles 5 are fixed on the cured resist layer 3. At this point, the particles 5 are formed such that the height of particles 5 (equal to the amplitude or height h of corrugations) and distribution density of particles 5 (equal to average period λ of corrugations) may satisfy the expressions (1) and (2) representing their relationship to the total thickness D of the magnetoresistance multilayer film. To this end, the second resist layer 4 is set to a sufficient thickness to form such particles. More particularly, the second resist layer 4 preferably has a thickness of about 0.003 to 1.0 μm.

In this way, the first shape substrate is formed.

On the other hand, in the case of step S3, a melt of a metal, dielectric or insulating material is directly applied onto the cured resist layer 3 as a very thin film whereby a multiplicity of fine semi-spherical particles 5 form spontaneously due to the material's own surface tension.

Preferred examples of the metal used herein include Au, Ag, Cu, Pt, W, Ti, Al, Mg, Mo, Zn, V, Hf, Zr, and Cr; preferred examples of the dielectric material used herein include $Ta_2O_5$, $TiO_2$, $BaTiO_3$, and $SrTiO_3$; and preferred examples of the insulating material used herein include SiO, $SiO_2$, $Al_2O_3$, ZnO, and MgO.

Where a metal is used to form the particles 5, the particles are dried and fixed before an insulating layer is formed thereon in step S5. The material of this insulating layer may be selected from the above-mentioned insulating materials desired for the particles. The insulating layer is preferably about 50 to 500 Å thick.

In this way, the first shape substrate is formed.

Figure 7:
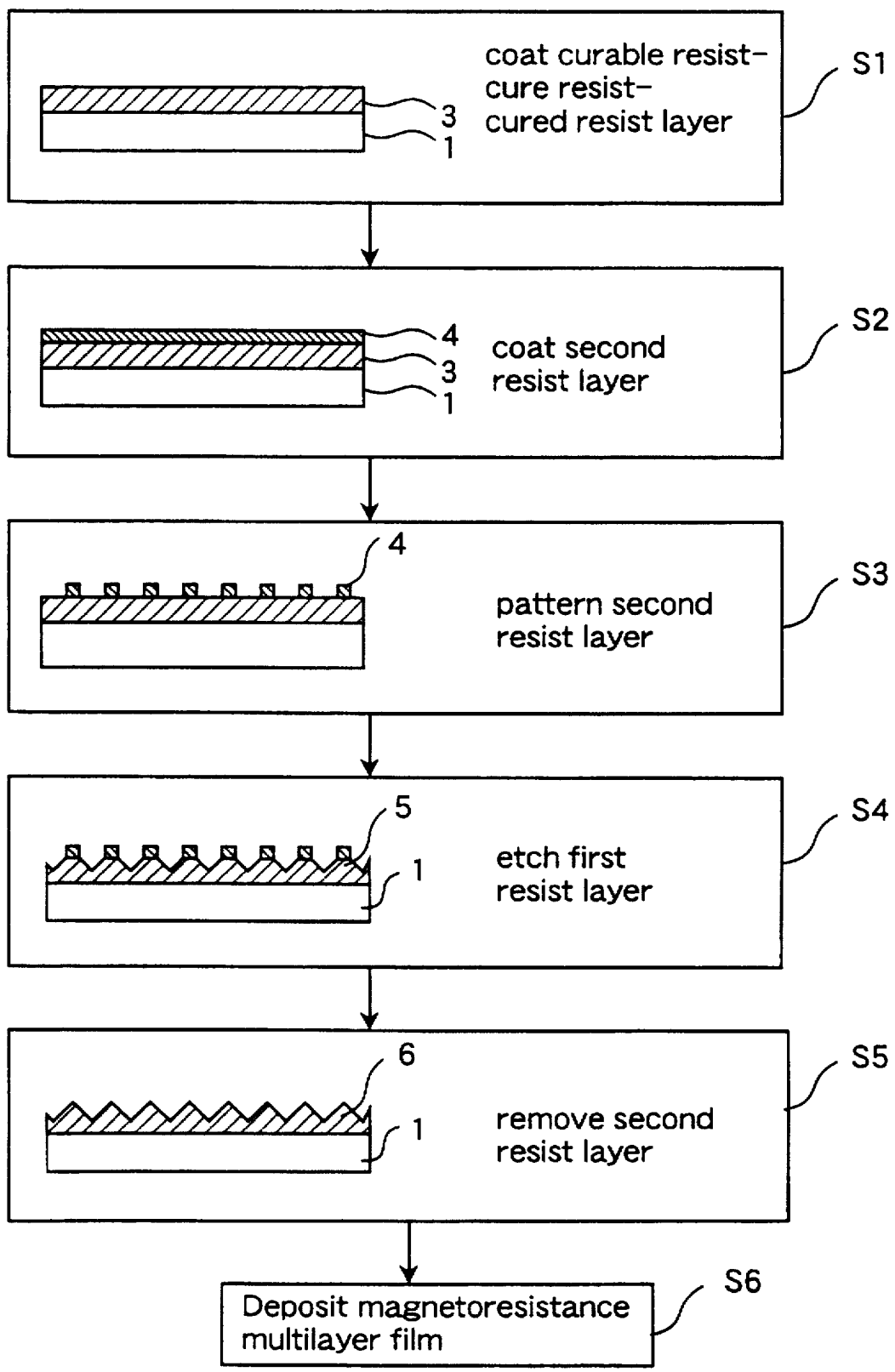
FIG. 7 is a view for illustrating a method for preparing the substrate shown in FIG. 2.

The second shape substrate is manufactured by a process as shown in FIG. 7.

As in the manufacture of the first shape substrate, the process starts with step S1 to form a curable resist layer 3 and step S2 to form a second resist layer 4. The resist used herein may be the same as used in the first shape substrate.

The second resist layer 4 is formed to a thickness which is less than the thickness of the cured resist layer 3 for the purpose of forming a more detailed pattern.

Next step S3 is to pattern the second resist layer 4. This patterning is preferably carried out by means of a stepper or the like. The patterning results in a distribution of square pole-shaped resist islands 4 arranged at a predetermined period (or pitch) on the substrate 1 in X and Y directions.

Subsequently, etching is carried out in step S4 using an etchant of KOH or HF, forming V-shaped furrows 5 extending in X and Y directions. Then in step S5, further etching is carried out to form a multiplicity of fine pyramidal protrusions 6 and the remaining second resist is removed, obtaining the second shape substrate.

On the first or second shape substrate prepared in the above-mentioned way, magnetic layers (thin films) and nonmagnetic layers (thin films) are formed in step S6 (see FIGS. 6 and 7) to produce a magnetoresistance multilayer film. Formation or deposition of magnetic layers (thin films) and nonmagnetic layers (thin films) may be carried out by evaporation, sputtering, and molecular beam epitaxy (MBE). In the manufacture of the above-mentioned artificial superlattice, an external magnetic field typically of 10 to 300 Oe is preferably applied in one direction in a film plane during formation of the first magnetic thin films. This results in a low $SQ_1$ and a high Hk.

Figure 8:
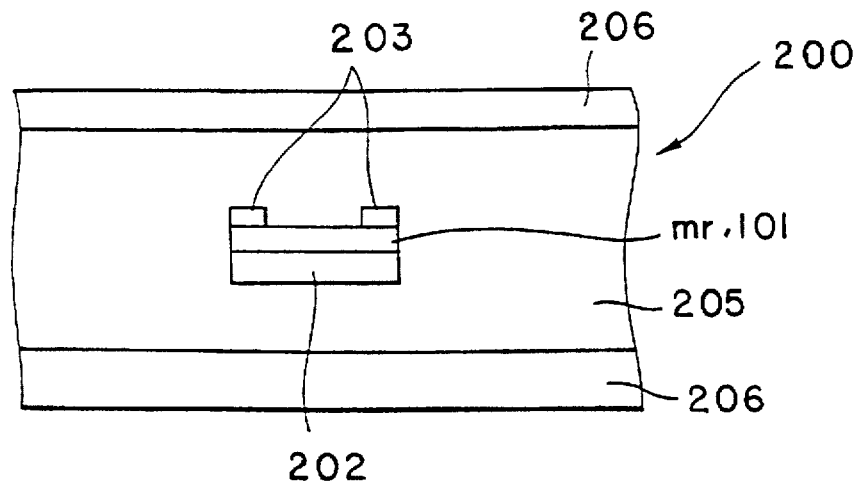
FIG. 8 is a partially cut-away elevation of a magnetoresistance change element according to one embodiment of the invention.
Figure 9:
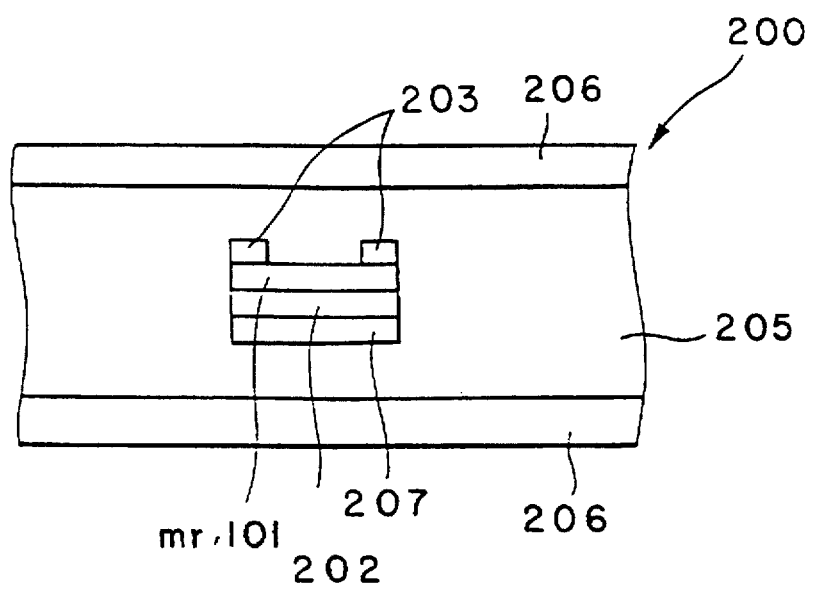
FIG. 9 is a partially cut-away elevation of a magnetoresistance change element according to another embodiment of the invention.

Referring to FIGS. 8 and 9, there are illustrated examples wherein the magnetoresistance multilayer film of the invention is used to construct a magnetoresistance element such as an MR head. The illustrated magnetoresistance element 200 includes a magnetoresistance multilayer film mr or artificial superlattice magnetic multilayer film 101 (magnetoresistance multilayer film mr is referred to as a representative, hereinafter) formed in an insulating layer 205, a pair of electrodes 203 and 203 of Cu, Ag, Au, etc. connected to the film for conducting measuring electric current across the magnetoresistance multilayer film mr, and a shunt layer 202 of Ti, etc. connected to the film. The magnetoresistance multilayer film mr is sandwiched between shields 206, 206 of Sendust, Permalloy, etc. In the example of FIG. 9, a layer made of a high resistivity soft magnetic material such as CoZrMo and NiFeRh is disposed below the shunt layer 202 for applying a bias magnetic field. Understandably, this means for applying a bias magnetic field need not be incorporated in the magnetic multilayer film of the invention because of its improved rise at zero magnetic field.

In manufacturing the magnetoresistance element as mentioned above, the patterning, flattening and other steps of the process require heat treatment such as baking, annealing and resist curing. Since the multilayer film of the invention is well resistant to heat, it fully withstands heat treatment at a temperature of up to 500° C., typically 50° to 400° C., especially 50° to 350° C. The heat treatment may generally be carried out in vacuum, an inert gas atmosphere or air.

In manufacturing a magnetoresistance element as mentioned above, only a portion of a substrate to become a magnetically sensitive section, that is, a portion of a substrate to form a magnetoresistance multilayer film thereon is given the substrate shape shown in FIG. 1 or 2 and a magnetoresistance multilayer film is formed only thereon. Alternatively, a substrate is formed with asperities over its entire surface, a magnetic multilayer film is formed thereon, a desired element pattern is protected with a resist, and the remaining unnecessary portion of the multilayer film is removed by ion milling. It is desired that the portion of a substrate other than the magnetically sensitive section is free of asperities so that current flow is not inhibited.

EXAMPLE

Examples of the present invention are given below by way of illustration.

The substrate used was an $Al_2O_3$—TiC substrate. As inventive sample Nos. 1 to 10, gold was slowly evaporated on the surface of the substrate to form a multiplicity of fine semi-spherical protrusions whose particle size and density were adjusted so as to provide corrugations having an average height h and average period k as reported in Table 1. The particle size was adjusted mainly by a deposition rate and time, and the density was adjusted mainly by a deposition time. Thereafter, an $SiO_2$ layer of 200 Å thick was formed as an insulating layer. On the other hand, as a comparative sample No. 11 (a magnetoresistance multilayer film in which the interface between layers is furrowed), a multiplicity of parallel furrows having an average height h of 400 Å and an average period λ of 350 Å (only a vertical cross-section in a direction transverse to the furrows has triangular shaped corrugations and the interface varies its height only in that direction) were formed on the substrate in accordance with the process of preparing the first shape substrate shown in FIG. 2. As comparative sample Nos. 12 to 14 (a magnetoresistance multilayer film having a flat interface between layers), the substrate was used as such.

Next, the thus prepared substrate was placed in a ultrahigh vacuum evaporation chamber which was evacuated to a vacuum of $10^{-9}$ to $10^{-10}$ Torr. While rotating the substrate at room temperature, an artificial superlattice magnetic multilayer film having a composition [$Ni_{0.8}Fe_{0.2}$ (thickness $d_2$)/Cu (thickness d)/Co (thickness $d_1$)/Cu (thickness d)]×n (recurring period) and a total thickness D (which was adjusted by varying n) as reported in Table 1 was formed as sample Nos. 1 to 14. With a magnetic field applied in one direction in a plane coextensive with the substrate, evaporation was carried out at a deposition rate of about 0.3 Å/sec. by molecular beam epitaxy (MBE). Note that $d_1$ and $d_2$ had values of 10 to 120 Å.

The samples were measured for magnetoresistance ratio and slope of magnetoresistance change. The results are shown in Table 1.

TABLE 1

| Sample No. | D (Å) | h (Å) | 2d (Å) | D-h (Å) | 9D/10 | λ | λ/h | MR ratio (%) | MR slope (%/Oe) |
|---|---|---|---|---|---|---|---|---|---|
| 1 | 1320 | 400 | 40 | 920 | 1188 | 350 | 0.875 | 9.2 | 0.90 |
| 2 | 660 | 200 | 30 | 460 | 594 | 300 | 1.500 | 8.6 | 0.88 |
| 3 | 440 | 250 | 20 | 190 | 396 | 300 | 1.200 | 8.3 | 0.82 |
| 4 | 300 | 150 | 100 | 150 | 270 | 300 | 2.000 | 7.8 | 0.73 |
| 5 | 520 | 350 | 140 | 170 | 468 | 500 | 1.429 | 7.1 | 0.71 |
| 6 | 1320 | 800 | 50 | 520 | 1188 | 2600 | 3.250 | 8.0 | 0.76 |
| 7 | 860 | 600 | 80 | 260 | 774 | 800 | 1.333 | 5.8 | 0.45 |
| 8 | 1320 | 300 | 50 | 1020 | 1188 | 1150 | 3.833 | 6.6 | 0.42 |
| 9 | 520 | 300 | 820 | 220 | 468 | 300 | 1.000 | 4.3 | 0.37 |
| 10 | 860 | 600 | 80 | 260 | 794 | 400 | 0.670 | 3.7 | 0.31 |
| Comparison (parallel furrows) | | | | | | | | | |
| 11 | 1320 | 400 | 40 | 920 | 1188 | 350 | 0.875 | 7.1 | 0.51 |
| Comparison (flat) | | | | | | | | | |
| 12 | 1320 | 0 | 50 | 1320 | 1188 | 0 | 0.000 | 4.6 | 0.24 |
| 13 | 520 | 0 | 320 | 520 | 468 | 0 | 0.000 | 3.2 | 0.20 |
| 14 | 860 | 0 | 80 | 860 | 794 | 0 | 0.000 | 3.1 | 0.21 |

Magnetization and a B–H loop were measured by means of a vibrating sample magnetometer. Resistance was determined by forming a sample sized 0.5×10 mm from the sample of the arrangement shown in Table 1, applying an external magnetic field in a plane and in a direction perpendicular to the current flow, and varying the magnetic field from −300 Oe to 300 Oe and measuring a resistance by a four-terminal method. From the resistance measurement, a minimum resistivity $\rho_{sat}$ and an MR ratio ΔR/R were determined. The percent MR ratio ΔR/R was calculated according to the equation:

$$\Delta R/R = (\rho max - \rho sat)/\rho sat \times 100\%$$

wherein $\rho_{max}$ is a maximum resistivity and $\rho_{sat}$ is a minimum resistivity. The difference in MR ratio in an applied magnetic field between −3 Oe and 3 Oe was determined and regarded as a slope at zero magnetic field for rise evaluation.

BENEFITS OF THE INVENTION

According to the present invention, there is obtained a magnetic multilayer film having a resistance ratio as great as several percents to several tens of percent under an external magnetic field as weak as several oersteds to several tens of oersted. The rise across zero magnetic field is fully satisfactory.

We claim:

1. A magnetic sensor comprising at least two magnetic layers formed on a substrate having a major surface, with a non-magnetic layer intervening between the magnetic layers, wherein each interface between said magnetic layers and said non-magnetic layer has corrugations in both X and Y directions, with the proviso that the X direction is a direction parallel to the substrate major surface and the Y direction is a direction orthogonal to the X direction and parallel to said substrate major surface, wherein among the corrugations in said X and Y directions all of the corrugations in at least one direction satisfy the following formula:

$$2d \leq (D-h) \leq 9D/10$$

and wherein all of the corrugations in at least one direction satisfy the following formula:

$$0.7 \leq \lambda/h \leq 3.5$$

wherein the corrugations have an average amplitude h and an average period $\lambda$, said magnetic sensor has a total thickness D and one non-magnetic layer has a thickness d.

2. The magnetic sensor of claim 1 wherein the corrugations are formed by providing a multiplicity of protrusions on said substrate and depositing magnetic layers and nonmagnetic layers thereon.

3. The magnetic sensor of claim 2 wherein said protrusions have a semi-spherical, semi-ellipsoidal, hyperboloidal or sinusoidal shape.

4. The magnetic sensor of claim 1 wherein the corrugations are formed by providing the substrate surface with a multiplicity of first parallel furrows extending in one direction and a multiplicity of second parallel furrows extending in a direction crossing said first parallel furrows and depositing magnetic layers and nonmagnetic layers thereon.

5. The magnetic sensor of claim 4 wherein said furrows have a semi-circular, semi-elliptic, hyperbolic, sinusoidal, U- or V-shaped cross-sectional shape.

6. The magnetic sensor of claim 1 wherein the corrugations are periodic corrugations.

7. The magnetic sensor of claim 1 wherein the direction of said corrugations in at least one direction is coincident with a direction of current flow.

8. A magnetoresistance element comprising the magnetic sensor of claim 1 as a magnetically sensitive section.

9. A magnetoresistance element comprising the magnetic sensor of claim 1 as a magnetically sensitive section wherein the direction of said corrugations in at least one direction is coincident with a direction of measuring current flow.

10. A method for preparing a magnetoresistance element comprising the steps of:

forming a plurality of corrugations on the surface of a substrate, wherein a portion of said corrugations are in an X direction parallel to said surface and a remaining portion of said corrugations are in a Y direction parallel to said surface and orthogonal to said X direction; and forming a magnetic sensor by alternately depositing magnetic layers and nonmagnetic layers on said surface wherein among the corrugations in said X and Y directions all of the corrugations in at least one direction satisfy the following formula:

$$2d \leq (D-h) \leq 9D/10$$

and wherein all of the corrugations in at least one direction satisfy the following formula:

$$0.7 \leq \lambda/h \leq 3.5$$

wherein the corrugations have an average amplitude h and an average period $\lambda$, said magnetic sensor has a total thickness D and one non-magnetic layer has a thickness d.

11. The method of claim 10, wherein said corrugations are in the form of protrusions, recesses, or a mixture thereof.

* * * * *